United States Patent
Estella Aguerri et al.

(10) Patent No.: US 11,206,713 B2
(45) Date of Patent: Dec. 21, 2021

(54) SUB-BAND COMPRESSION DOMAIN PROCESSING FOR UPLINK MIMO SYSTEMS

(71) Applicant: Huawei Technologies Co., Ltd., Shenzhen (CN)

(72) Inventors: Inaki Estella Aguerri, Boulogne Billancourt (FR); Meryem Benammar, Boulogne Billancourt (FR); Abdellatif Zaidi, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 103 days.

(21) Appl. No.: 16/728,989

(22) Filed: Dec. 27, 2019

(65) Prior Publication Data

US 2020/0137835 A1 Apr. 30, 2020

Related U.S. Application Data

(63) Continuation of application No. PCT/EP2017/065984, filed on Jun. 28, 2017.

(51) Int. Cl.
*H04W 4/00* (2018.01)
*H04W 88/08* (2009.01)
(Continued)

(52) U.S. Cl.
CPC ........... *H04W 88/085* (2013.01); *H03M 7/40* (2013.01); *H04B 7/0413* (2013.01);
(Continued)

(58) Field of Classification Search
CPC ............ H04W 88/085; H04W 72/044; H04W 72/0446; H04W 72/0453; H03M 7/40;
(Continued)

(56) References Cited

U.S. PATENT DOCUMENTS

| 8,005,152 B2 * | 8/2011 | Wegener | H03M 7/40 375/241 |
| 8,705,634 B2 * | 4/2014 | Wegener | H03M 7/40 375/241 |

(Continued)

FOREIGN PATENT DOCUMENTS

| CN | 102037694 A | 4/2011 |
| CN | 102197629 A | 9/2011 |

(Continued)

OTHER PUBLICATIONS

Vosoughi et al., "Baseband signal compression in wireless base stations," in Global Communications Conference (GLOBECOM), 2012 IEEE, pp. 4505-4511, Institute of Electrical and Electronics Engineers, New York, New York (Dec. 2012).

(Continued)

*Primary Examiner* — Helene E Tayong
(74) *Attorney, Agent, or Firm* — Leydig, Voit & Mayer, Ltd.

(57) ABSTRACT

A multi-antenna receiver within an uplink MIMO communication system is described. The antenna receiver includes an RRU and a BBU communicating between themselves through a fronthaul (FH) link. The multi-antenna receiver significantly decreases the fronthaul (FH) throughput requirements, while guaranteeing a low EVM between the time-domain signals transmitted from the users towards the RRU and the signals reconstructed and recovered at the BBU. The RRU processes the obtained frequency-domain signals in a space of dimensionality N by projecting them into a signal space of lower dimensionality (N') and compressing them in the obtained projected signal subspace. At the BBU, the frequency-domain signals are decompressed and reconstructed on the projected signal subspace, before recovering the transmitted time-domain signals.

18 Claims, 8 Drawing Sheets

(51) Int. Cl.

| | | |
|---|---|---|
| *H04B 7/0456* | (2017.01) | |
| *H04B 7/06* | (2006.01) | |
| *H04W 72/04* | (2009.01) | |
| *H03M 7/40* | (2006.01) | |
| *H04B 7/0413* | (2017.01) | |

(52) U.S. Cl.
CPC ......... *H04B 7/0456* (2013.01); *H04B 7/0626* (2013.01); *H04W 72/044* (2013.01); *H04W 72/0446* (2013.01); *H04W 72/0453* (2013.01)

(58) Field of Classification Search
CPC .. H04B 7/0413; H04B 7/0456; H04B 7/0626; H04L 27/2626
USPC .......................................................... 370/329
See application file for complete search history.

(56) References Cited

U.S. PATENT DOCUMENTS

| | | | |
|---|---|---|---|
| 9,059,778 B2* | 6/2015 | Ling | ............... H04L 27/2615 |
| 9,438,318 B2* | 9/2016 | Hanson | ............... H04L 5/0005 |
| 2012/0087358 A1 | 4/2012 | Zhu et al. | |
| 2012/0176966 A1* | 7/2012 | Ling | ............... H04W 88/085 |
| | | | 370/328 |
| 2013/0003817 A1 | 1/2013 | Ling et al. | |
| 2013/0287069 A1 | 10/2013 | Su et al. | |
| 2015/0117277 A1 | 4/2015 | Liu | |
| 2017/0079059 A1 | 3/2017 | Li et al. | |

FOREIGN PATENT DOCUMENTS

| | | |
|---|---|---|
| CN | 103039029 A | 4/2013 |
| CN | 103222200 A | 7/2013 |
| CN | 102932043 B | 5/2015 |
| CN | 105577598 A | 5/2016 |
| CN | 106453163 A | 2/2017 |
| KR | 20030066091 A | 8/2003 |
| KR | 20080068025 A | 7/2008 |
| WO | 2009009959 A1 | 1/2009 |
| WO | 2009151893 A2 | 12/2009 |

OTHER PUBLICATIONS

Peng et al., "Fronthaul-constrained cloud radio access networks: insights and challenges," IEEE Wireless Communications, IEEE Service Center Piscataway, New Jersey, vol. 22, No. 2, XP011579861, pp. 152-160, Institute of Electrical and Electronics Engineers, New York, New York (Apr. 1, 2015).

Guo et al., "CPRI compression transport for LTE and LTE-A signal in C-RAN," in Communications and Networking in China (CHINACOM), 2012 7th International ICST Conference on, pp. 843-849 (Aug. 2012).

Chai et al., "SPIRO: Turning elephants into mice with efficient RF transport," 2015 IEEE Conference on Computer Communications(INFOCOM), XP055297615, pp. 819-827, Institute of Electrical and Electronics Engineers, New York, New York (Apr. 1, 2015).

Nanba et al., "A new IQ data compression scheme for front-haul link in Centralized RAN," in Personal, Indoor and Mobile Radio Communications (PIMRC Workshops), 2013 IEEE 24th International Symposium, pp. 210-214, Institute of Electrical and Electronics Engineers, New York, New York (Sep. 2013).

Ren et al., "A compression method for LTE-A signals transported in radio access networks," 2014 21st International Conference on Telecommunications (ICT), IEEE, XP032612089, pp. 293-297, Institute of Electrical and Electronics Engineers, New York, New York (May 4, 2014).

Nieman et al., "Time-domain compression of complex-baseband LTE signals for cloud radio access networks," in Global Conference on Signal and Information Processing (Global-SIP), 2013 IEEE, pp. 1198-1201, Institute of Electrical and Electronics Engineers, New York, New York (Dec. 2013).

Lorca et al., "Lossless compression technique for the fronthaul of LTE/LTE-advanced cloud-RAN architectures," in World of Wireless, Mobile and Multimedia Networks (WoWMoM), 2013 IEEE 14th International Symposium and Workshops, pp. 1-9, Institute of Electrical and Electronics Engineers, New York, New York (Jun. 2013).

Gamal et al., "Network Information Theory," Cambridge University Press, total 714 pages, (2011).

* cited by examiner

SUB-BAND COMPRESSION DOMAIN PROCESSING FOR UPLINK MIMO SYSTEMS

CROSS-REFERENCE TO RELATED APPLICATIONS

This application is a continuation of International Application No. PCT/EP2017/065984, filed on Jun. 28, 2017, the disclosure of which is hereby incorporated by reference in its entirety.

TECHNICAL FIELD

The present invention disclosure relates to the field of wireless communications, and more particularly to the field of cloud communications over distributed nodes connected through fronthaul links.

BACKGROUND

Massive multi-input multi-output (M-MIMO) systems operating over large bandwidths are considered to be one of the most promising technologies to increase the spectral efficiency in next-generation cellular systems. The most popular implementation for M-MIMO stations relies on a distributed architecture, in which the base station (BS) baseband (BB) processing (e.g., beamforming and waveform generation) and the radio processing (e.g., radio frequency (RF) processing and analog-to-digital conversion (ADC) or digital-to-analog conversion (DAC)) are respectively carried out by separate units such as a base band unit (BBU) on one hand and remote radio units (RRUs), also known as radio resource units (RRUs), on the other hand, which are usually remotely located. One or more RRUs, each formed, for example, of blocks of antennas, can be connected to the BBU through respective fronthaul (FH) links (e.g., optical fibers), which transmit in-phase and quadrature (IQ) samples between the one or more RRUs and the BBU, as depicted in the typical MIMO receiver 100 of FIG. 1. The RRU can be installed close to the antennas, while the BBU can be located at the base of a building or at a remote location, thereby reducing the cost and adding flexibility to the deployment of the BSs. In an uplink, for example, a RRU can thus apply a RF processing and ADC operations in order to obtain a digitized version of the received signal, while the BBU unit is in charge of the BB processing functionalities of the IQ samples from the RRU, such as the frequency-domain functionalities (e.g., inverse fast Fourier transform (IFFT) and cyclic prefix (CP) addition for orthogonal frequency division multiplexing (OFDM) waveforms), the receive filtering and the bit level decoding.

The throughput requirements of the FH links in terms of communication of the IQ samples between the BBU and the RRUs can become easily prohibitive in the case of high bandwidths and a large number of antennas. It is the reason why many common public radio interface (CPRI) compression algorithms have been considered in the literature (e.g., K. F. Nieman and B. L. Evans, "Time-domain compression of complex-baseband LTE signals for cloud radio access networks", Proc. IEEE Global Conference on Signal and Information Processing (Global-SIP), pp. 1198-1201, December 2013), in order to reduce the amount of data communicated between BBU and RRUs without significantly affecting the end-to-end performance. For illustrative purposes, FIG. 2 shows a typical MIMO system 200, in which user equipment (UE) devices transmit a message over a frequency selective channel towards a multi-antenna receiver, which in turn transmits, through a FH link, uplink I/Q samples from a compression algorithm block in the RRU towards a decompression algorithm block in the BBU and downlink I/Q samples from a compression algorithm block in the BBU towards a decompression algorithm block in the RRU. While these compression algorithms can be applied straightforwardly in MIMO base stations (BSs) in a per antenna basis, most of them are designed for single antenna devices and fail to exploit the particular features of multi-antenna BB signals, which are correlated not only over time samples but also over space, i.e., between the antennas. In addition, the number of received or transmitted beams (i.e., beamformed data streams) is usually much smaller than the number of antennas in the BS. For example, in the uplink, this implies that the relevant information derived from the signal transmitted by a user, such as a user equipment (UE), lies in a subspace of that in which the received signal lies. This sparsity in dimensionality can be exploited to improve the signal compression in addition to the correlation in time and space.

On the other hand, typical compression algorithms are designed to guarantee a good reconstruction of the IQ samples of the input signal of the compressor with low distortion (e.g., the received signal in uplink). In order to make the compression process transparent to the system, the compressed signal is reconstructed in the original domain of the input signal, i.e., either in the time domain or in the frequency domain. However, this is not required from an information theoretical standpoint, so that the end-to-end goal of having a low distortion or a low error vector magnitude (EVM) between the signals transmitted from the UEs and their reconstruction at the destination unit (i.e., at the BBU of the receiver) can be achieved as long as the relevant information of the signal is provided to the BBU in any other appropriate representation format or basis. This reconstruction process of signals transmitted from the UEs over a frequency selective channel is illustrated in FIG. 3, which shows a detailed view of a typical MIMO system 300 comprising, at the receiver, analog-to-digital converters (ADC)s, compression and decompression algorithm blocks operating in the time domain at the RRU and BBU, respectively, a frequency processing block configured to perform a fast Fourier transform (FFT) and a cyclic prefix (CP) removal aiming to eliminate the time domain redundancy from CP, a linear receive filtering denoted by $P_i$ and a bit level processing block.

SUMMARY

It is therefore an object of the present disclosure to decrease the communication data requirements at a multi-antenna receiver between one or more receiving nodes (RRUs) and one or more baseband processing nodes (BBUs) while not compromising the quality of a signal that is transmitted from one or more UE devices towards the multi-antenna receiver and reconstructed and recovered at the baseband processing nodes (BBUs).

The object is achieved by the features of the independent claims. Further embodiments of the disclosure are apparent from the dependent claims, the description and the drawings.

According to a first aspect, the disclosure relates to an apparatus (RRU) within an uplink multi-input multi-output (MIMO) communication system. The apparatus (RRU) is configured to receive, from a number N of antennas, a respective digital time-domain signal, each received digital time-domain signal carrying a same set of $N_{sc}$ subcarriers, the subcarriers having a same number $N_{ss}$ of symbols per subcarrier, configured to convert each received digital time-domain signal to a respective converted digital frequency-domain signal ($Y_i$) having $N_{sc}$ subcarriers and $N_{ss}$ symbols per subcarrier, configured to group, per subcarrier, the $N_{ss}$ symbols of each converted digital frequency-domain signal ($Y_i$) as to obtain, in each one of the $N_{sc}$ subcarriers, a respective grouped digital frequency-domain signal ($Y^g$) of $N \times N_{ss}$ symbols, configured to combine, per subcarrier, the $N \times N_{ss}$ symbols of each grouped digital frequency-domain signal ($Y^g$) into $N' \times N_{ss}$ symbols with $N'$ being a number lower than N, as to obtain, in each one of the $N_{sc}$ subcarriers, a respective combined digital frequency-domain signal ($\overline{Y^g}$) of $N' \times N_{ss}$ symbols, and configured to quantize (i.e., compress) the $N' \times N_{ss}$ symbols of the combined digital frequency-domain signals ($\overline{Y^g}$) in each subcarrier, as to obtain, in each subcarrier, a respective quantized (i.e., compressed) digital frequency-domain signal of quantization bits.

By obtaining a combined (i.e., projected) digital frequency-domain signal prior to obtaining a quantized digital frequency-domain signal of quantization bits, the RRU apparatus may thereby reduce the communication rate requirements with respect to a communicating BBU apparatus by exploiting the correlation between the digital time-domain signals received at the N antennas. Moreover, by compressing the projected space, only the relevant signal is compressed and sent towards the BBU. Furthermore, by directly processing in the projected space, the compression does not need to forward the data (overhead) about the transformation required to invert the projection.

According to a further implementation form of the first aspect, the subcarriers are grouped into resource blocks (RBs) according to a pattern, each resource block (RB) having a number ($N_{sRB}$) of subcarriers.

In the long-term evolution (LTE) standard, a resource block (RB) may be defined as the smallest unit of resources that can be allocated to a user. Each user is allocated a number of resource blocks in a two-dimensional (i.e, frequency and time) grid.

As regards the pattern, the subcarriers may be grouped, for example, according to the same RBs and the same transmission time interval (TTI) or according to multiple RBs and multiple TTIs. In an embodiment, the pattern may be predefined by being, for example, transmitted towards the RRU and/or the BBU in advance. In another embodiment, the pattern may be dynamically changed and updated by being, for example, regularly transmitted towards the RRU and/or the BBU through the fronthaul (FH) link.

According to a further implementation form of the first aspect, the apparatus (RRU) is configured to estimate statistical information of each one of the grouped digital frequency-domain signals ($Y^g$).

According to a further implementation form of the first aspect, the statistical information of each one of the grouped digital frequency-domain signals ($Y^g$) is estimated using a covariance matrix ($C^g$) of each one of the grouped digital frequency-domain signals ($Y^g$).

According to a further implementation form of the first aspect, the $N \times N_{ss}$ symbols of each grouped digital frequency-domain signal ($Y^g$) are combined, in each subcarrier, into $N' \times N_{ss}$ symbols through filtering.

According to a further implementation form of the first aspect, the filtering is performed using a projection matrix ($W_i$).

According to a further implementation form of the first aspect, the projection matrix ($W_i$), the number $N'$ and the number of quantization bits are determined using the statistical information.

According to a further implementation form of the first aspect, the apparatus is configured to transmit a set of overhead parameters, wherein the set of overhead parameters comprises the value of the number $N'$, the values ($B_1, \ldots, B_{N'}$) of each quantization bit, and the eigenvalues ($\lambda_1, \lambda_2, \ldots, \lambda_{N'}$) of each covariance matrix ($C^g$).

According to a further implementation form of the first aspect, the apparatus is configured to transmit the quantization bits of each subcarrier by transmitting the respective quantized digital frequency-domain signals.

The above object is also solved in accordance with a second aspect.

According to the second aspect, the disclosure relates to an apparatus (BBU) within an uplink multi-input multi-output (MIMO) communication system. The apparatus (BBU) is configured to receive, at each one of the $N_{sc}$ subcarriers as specified in the first aspect, a respective quantized digital frequency-domain signal as specified in a further implementation form of the first aspect, configured to receive a set of overhead parameters as specified in a further implementation form of the first aspect, configured to decompress each quantized digital frequency-domain signal using the set of overhead parameters as to obtain, in each one of the $N_{sc}$ subcarriers, a respective decompressed digital frequency-domain signal of $N' \times N_{ss}$ symbols, configured to degroup each decompressed digital frequency-domain signal of $N' \times N_{ss}$ symbols, as to obtain a respective degrouped digital frequency-domain signal of $N' \times N_{ss}$ symbols, configured to estimate respective channel state information (CSI) based on the set of overhead parameters, the respective degrouped digital frequency-domain signal of $N' \times N_{ss}$ symbols and a quantization noise (Q), as to obtain a respective estimated CSI, configured to filter each degrouped digital frequency-domain signal of $N' \times N_{ss}$ symbols using a respective filtering coefficient ($P_i$) which is computed based on the respective estimated CSI and the quantization noise (Q), as to obtain a respective filtered digital frequency-domain signal of $L \times N_{ss}$ symbols, where L equals a number of transmitters (UEs), and configured to decode each filtered digital frequency-domain signal as to obtain a respective decoded signal.

Thereby, the processing carried out at the BBU on the signal to be decompressed and reconstructed takes the effects of the combination (i.e., projection) and the quantization (i.e., compression) into account, and the quality of the signal being decompressed and reconstructed on the projected signal subspace may be not compromised when the FH throughput gets reduced. Moreover, the complexity of the baseband processing and the channel state information (CSI) estimation requirements may also be reduced since the projected space has a dimensionality $N'$ lower than the dimensionality N of the originally received signal.

Furthermore, the decompressed signal may be degrouped by being mapped to the original format of the received signal.

The above object is also solved in accordance with a third aspect.

According to the third aspect, the disclosure relates to a multi-antenna receiver (Rx) within an uplink multi-input multi-output (MIMO) communication system. The multi-antenna receiver (Rx) comprises at least one apparatus (RRU) as claimed in the first aspect and/or any one of the further implementation forms of the first aspect, at least one apparatus (BBU) as claimed in the second aspect, and a fronthaul (FH) link.

In a further implementation form of the third aspect, the multi-antenna receiver (Rx) comprises a number N of antennas as specified in the first aspect, each antenna being configured to receive an analog time-domain signal as to obtain a respective received analog time-domain signal, and a number N of analog-to-digital (ADC) devices, each ADC device being configured to convert its respective received analog time-domain signal to a respective digital time-domain signal as specified in the first aspect.

In a further implementation form of the third aspect, the respective quantized digital frequency-domain signal as specified in a further implementation form of the first aspect and the set of overhead parameters as specified in a further implementation form of the first aspect are transmitted from the at least one RRU towards the at least one BBU through the FH link.

The above object is also solved in accordance with a fourth aspect.

According to the fourth aspect, the disclosure relates to an uplink multi-input multi-output (MIMO) communication system. The uplink MIMO communication system comprises at least one multi-antenna receiver (Rx) as individually claimed in the third aspect and/or the further implementation form of the third aspect, and a number L of transmitters (UEs) as specified in the second aspect, wherein each one of the L transmitters (Tx, UEs) is configured to transmit a respective message ($m_l$) using at least $N_{ss}$ symbols ($X_{l,i}$) per subcarrier towards the at least one multi-antenna receiver (Rx) through a frequency selective channel, wherein an analog time-domain signal as specified in a further implementation form of the third aspect is derived from the message ($m_l$) using at least $N_{ss}$ symbols ($X_{l,i}$) per subcarrier.

Thereby, the L transmitters (UEs) may transmit their respective message over a set of subcarriers comprising all the subcarriers. However, it should also be understood that, in another embodiment, the L transmitters (UEs) may transmit their respective message over a subset of subcarriers comprising some subcarriers.

According to a further implementation form of the fourth aspect, each filtered digital frequency-domain signal of $L \times N_{ss}$ symbols gives an estimation of the at least $N_{ss}$ symbols ($X_{l,i}$) transmitted from each one of the L transmitters (UEs) by transmitting their respective message ($m_l$).

According to a further implementation form of the fourth aspect, each decoded signal as specified in the second aspect is the respective message ($m_l$).

The above object is also solved in accordance with a fifth aspect.

According to the fifth aspect, the disclosure relates to a method within an uplink multi-input multi-output (MIMO) communication system. The method comprises the step of receiving, from a number N of antennas, a respective digital time-domain signal, wherein each received digital time-domain signal carries a same set of $N_{sc}$ subcarriers and the subcarriers have a same number $N_{ss}$ of symbols per subcarrier, the step of converting each received digital time-domain signal to a respective converted digital frequency-domain signal ($Y_i$) having $N_{sc}$ subcarriers and $N_{ss}$ symbols per subcarrier, the step of grouping, per subcarrier, the $N_{ss}$ symbols of each converted digital frequency-domain signal ($Y_i$) as to obtain, in each one of the $N_{sc}$ subcarriers, a respective grouped digital frequency-domain signal ($Y^g$) of $N \times N_{ss}$ symbols, the step of combining, per subcarrier, the $N \times N_{ss}$ symbols of each grouped digital frequency-domain signal ($Y^g$) into $N' \times N_{ss}$ symbols with N' being a number lower than N, as to obtain, in each one of the $N_{sc}$ subcarriers, a respective combined digital frequency-domain signal ($\overline{Y^g}$) of $N' \times N_{ss}$ symbols, and the step of quantizing the $N' \times N_{ss}$ symbols of the combined digital frequency-domain signals ($\overline{Y^g}$) in each subcarrier as to obtain, in each subcarrier, a respective quantized digital frequency-domain signal of quantization bits.

According to a further implementation form of the fifth aspect, the method may comprise the step of estimating statistical information of each one of the grouped frequency-domain signals.

According to a further implementation form of the fifth aspect, the method comprises the step of transmitting a set of overhead parameters, wherein the set of overhead parameters comprises the value of the number N', the values ($B_1, \ldots, B_{N'}$) of each quantization bit, and the eigenvalues ($\lambda_1, \lambda_2, \ldots, \lambda_{N'}$) of each covariance matrix ($C^g$) of each one of the grouped digital frequency-domain signals ($Y^g$).

According to a further implementation form of the fifth aspect, the method comprises the step of transmitting the quantization bits of each subcarrier by transmitting the respective quantized digital frequency-domain signals.

The above object is also solved in accordance with a sixth aspect.

According to the sixth aspect, the disclosure relates to a method within an uplink multi-input multi-output (MIMO) communication system. The method comprises the step of receiving, at each one of the $N_{sc}$ subcarriers as specified in the fifth aspect, a respective quantized digital frequency-domain signal as specified in a further implementation form of the fifth aspect, the step of receiving a set of overhead parameters as specified in a further implementation form of the fifth aspect, the step of decompressing each quantized digital frequency-domain signal using the set of overhead parameters, as to obtain, in each one of the $N_{sc}$ subcarriers, a respective decompressed digital frequency-domain signal of $N' \times N_{ss}$ symbols, the step of degrouping each decompressed digital frequency-domain signal of $N' \times N_{ss}$ symbols, as to obtain a respective degrouped digital frequency-domain signal of $N' \times N_{ss}$ symbols, the step of estimating respective channel state information (CSI) based on the set of overhead parameters, the respective degrouped digital frequency-domain signal of $N' \times N_{ss}$ symbols and a quantization noise (Q), as to obtain a respective estimated CSI, the step of filtering each degrouped digital frequency-domain signal of $N' \times N_{ss}$ symbols using a respective filtering coefficient ($P_i$) which is computed based on the respective estimated CSI and the quantization noise (Q), as to obtain a respective filtered digital frequency-domain signal of $L \times N_{ss}$ symbols, where L equals a number of transmitters (UEs), and the step of decoding each filtered digital frequency-domain signal as to obtain a respective decoded signal.

The above object is also solved in accordance with a seventh aspect.

According to the seventh aspect, the disclosure relates to a computer program comprising a program code for performing the method according to the fifth aspect and/or any one of the further implementation forms of the fifth aspect and/or according to the sixth aspect, when executed on a computer.

Thereby, the method can be performed in an automatic and repeatable manner.

The computer program can be performed by the above apparatuses.

More specifically, it should be noted that all the above apparatuses may be implemented based on a discrete hardware circuitry with discrete hardware components, integrated chips or arrangements of chip modules, or based on a signal processing device or chip controlled by a software routine or program stored in a memory, written on a computer-readable medium or downloaded from a network such as the Internet.

It shall further be understood that a preferred embodiment of the disclosure can also be any combination of the dependent claims or above embodiments with the respective independent claim.

These and other aspects of the disclosure will be apparent and elucidated with reference to the embodiments described hereinafter.

BRIEF DESCRIPTION OF THE DRAWINGS

In the following detailed portion of the present disclosure, the disclosure will be explained in more detail with reference to the exemplary embodiments shown in the drawings, in which.

Identical reference signs are used for identical or at least functionally equivalent features.

DETAILED DESCRIPTION OF EMBODIMENTS OF THE INVENTION

Figure 1:
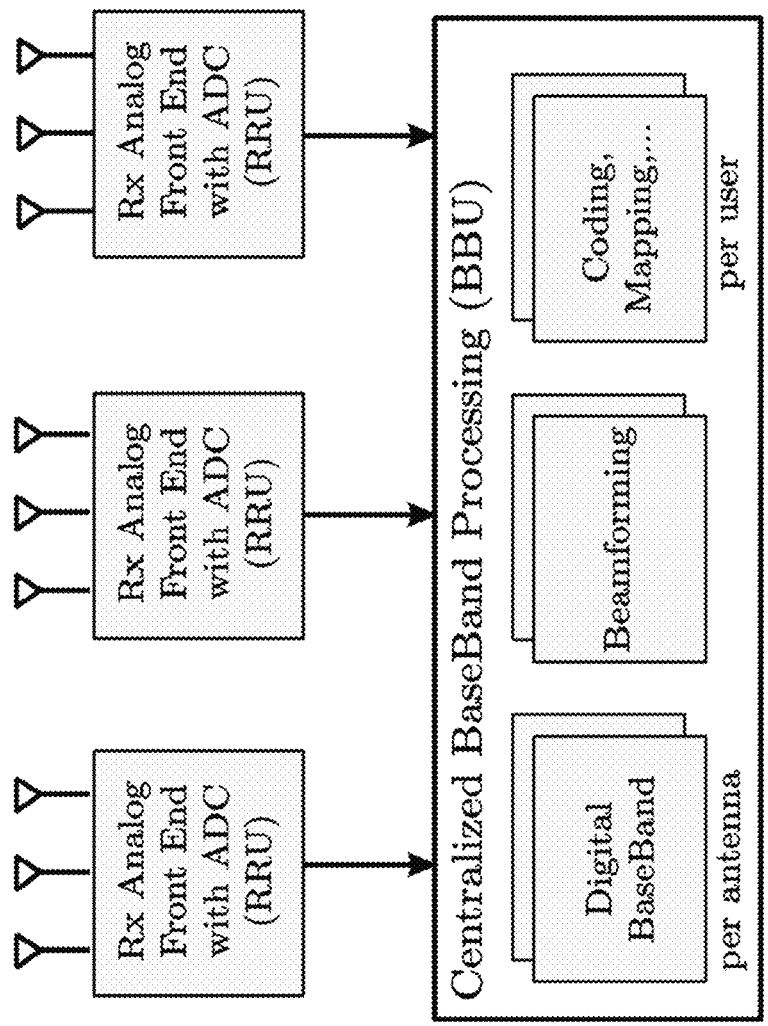
FIG. 1 shows a typical MIMO receiver 100 comprising multiple RRUs respectively connected to a centralized BBU through respective FH links.
Figure 2:
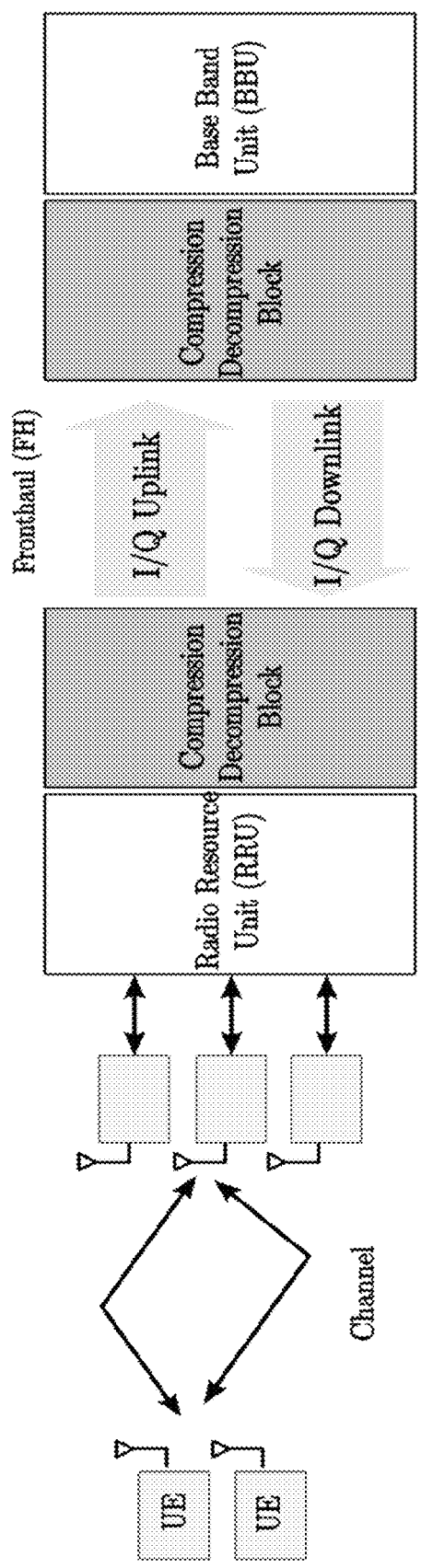
FIG. 2 shows a typical MIMO system 200, in which a multi-antenna receiver transmits, through a FH link, uplink I/Q samples from a compression algorithm block in the RRU towards a decompression algorithm block in the BBU and downlink I/Q samples from a compression algorithm block in the BBU towards a decompression algorithm block in the RRU.
Figure 3:
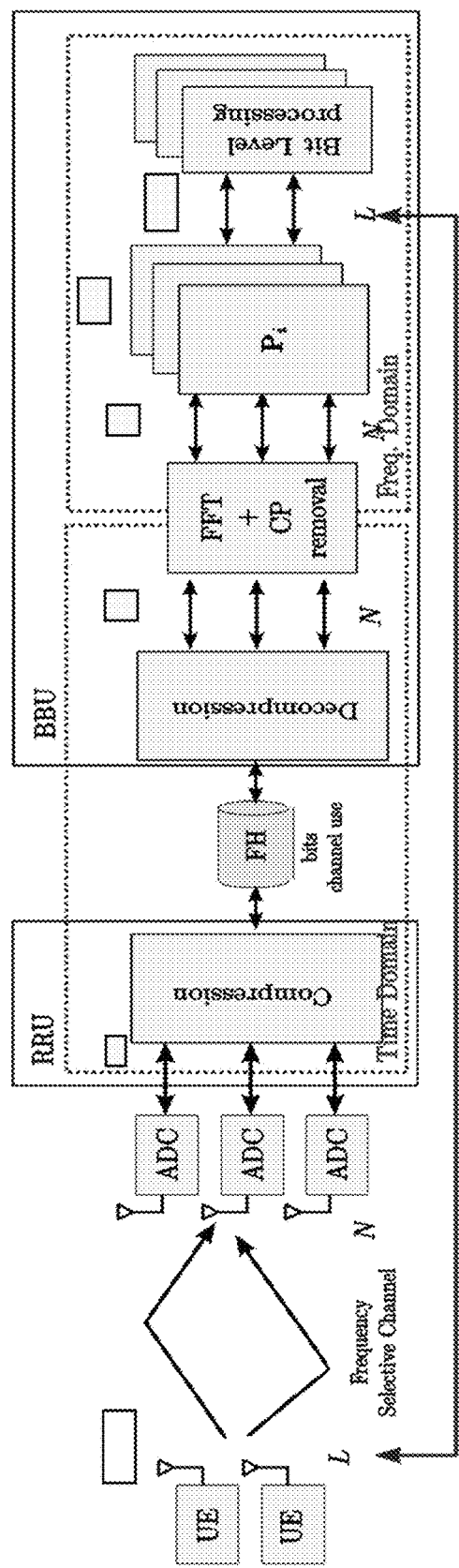
FIG. 3 shows a detailed view of a typical MIMO system 300 illustrating, at the receiver, a process of reconstruction of signals transmitted from the UEs over a frequency selective channel, wherein compression and decompression algorithm blocks operate in the time domain at the RRU and BBU, respectively.
Figure 4:
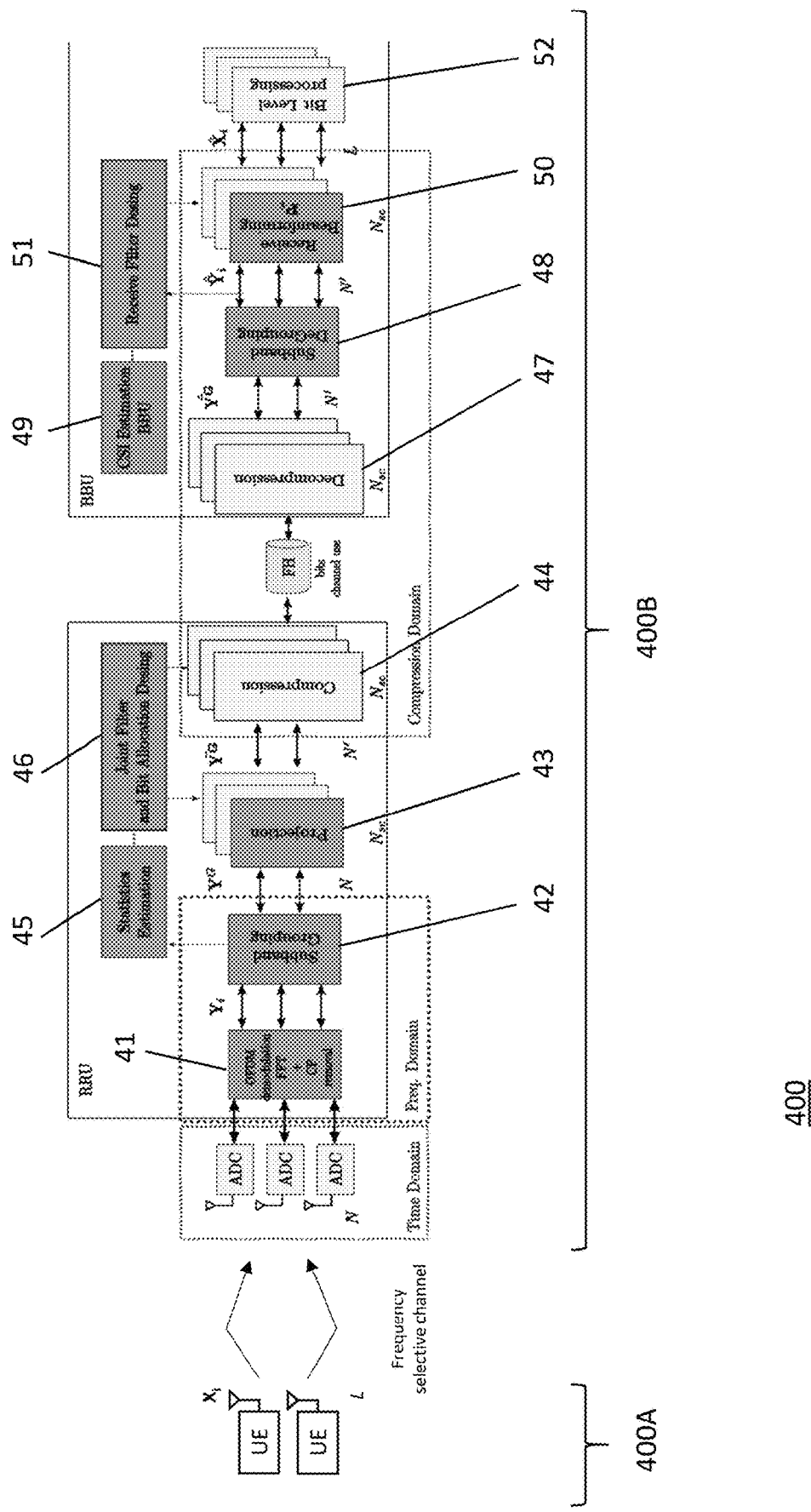
FIG. 4 shows an uplink multi-input multi-output (MIMO) communication system 400 wherein transmitters 400A communicate with a multi-antenna receiver 400B, according to an embodiment of the present invention.

FIG. 4 shows an uplink multi-input multi-output (MIMO) communication system 400, wherein L transmitters 400A, such as user equipment (UE) devices and users, transmit a respective message ($m_l$) and thereby a respective analog time-domain signal derived from the respective message ($m_l$) towards one or more multi-antenna receivers 400B through a frequency selective channel.

As illustrated in the embodiment of FIG. 4, the multi-antenna receiver 400B comprises a radio resource unit (RRU) and a baseband unit (BBU) communicating between themselves through a fronthaul (FH) link. In a more general embodiment, the multi-antenna receiver 400B may comprise one or more radio resource units (RRUs) and one or more baseband units (BBUs), wherein the RRUs and the BBUs communicate between themselves through a respective FH link. In addition, the multi-antenna receiver 400B is equipped with N antennas (also designated as N receive antennas) and applies at each of them radio frequency (RF) processing through a number N of respective RF chains and analog-to-digital conversion through a number N of respective analog-to-digital converters (ADCs). In another exemplary embodiment, the RF chains and the ADCs may be part of the RRU.

In the following and in a non-limiting manner, an OFDM-type uplink waveform, e.g., a single-carrier frequency division multiple access (SC-FDMA) waveform, with $N_{sc}$ subcarriers and $N_g$ samples of cyclic prefix (CP), will be considered. The $N_{sc}$ subcarriers may then be grouped into resource blocks (RBs) having each a number (e.g., $N_{sRB}$) of subcarriers, so that an individual resource block $RB_g$ (where g=1, ..., G) corresponds to a respective group g (where g=1, ..., G). In the long-term evolution (LTE) standard, a resource block (RB) may be defined as the smallest unit of resources that can be allocated to a user, each user being allocated a number of resource blocks in a two-dimensional (i.e., frequency and time) grid. During one transmission time interval (TTI) or one subframe, $N_{ss}$ symbols are transmitted per subcarrier and each one of these $N_{ss}$ symbols consists of $N_c$ data symbols and $N_g$ samples of CP, so that a resource block (RB) has dimensions of subcarriers by symbols.

The operation of the uplink MIMO communication system 400 will be now described in a more detailed manner while considering, only for purposes of simplicity, a single RB with L independent single-antenna transmitters 400A (e.g., UE devices, users) transmitting $N_{ss}$ symbols during one TTI per subcarrier. In another exemplary embodiment, the L independent transmitters 400A may be multi-antenna transmitters instead of single-antenna transmitters.

The l-th (l=1, ..., L) transmitter 400A, which intends to transmit a message $m_l$ at a transmission rate $R_l$ towards the multi-antenna receiver 400B, maps the message $m_l$ into a channel input sequence $x_l \in \mathbb{R}^{1 \times n}$ of length $n = N_{ss} \cdot N_{sRB}$ by, for example, concatenating a quadrature amplitude modulation (QAM) with a forward-error-correcting (FEC) code. Each transmitter 400A maps the n symbols into the $N_{sRB} \times N_{ss}$ subcarriers so that $X_i = [x_{1,i}, \ldots, x_{L,i}] \in \mathbb{R}^{L \times N_{ss}}$ are the symbols transmitted in the i-th subcarrier. In an embodiment, it will be assumed an average transmit power constraint $E[|x_l|^2]$ being equal to P. In another exemplary embodiment, the transmitters 400A may have a different transmit power per transmitter (i.e., user). Afterwards, each transmitter 400A generates a respective analog time-domain signal using an OFDM-like modulation with inverse FFT (IFFT) and CP addition, and forwards its respective analog time-domain signal over the frequency selective channel towards the multi-antenna receiver 400B.

Figure 5:
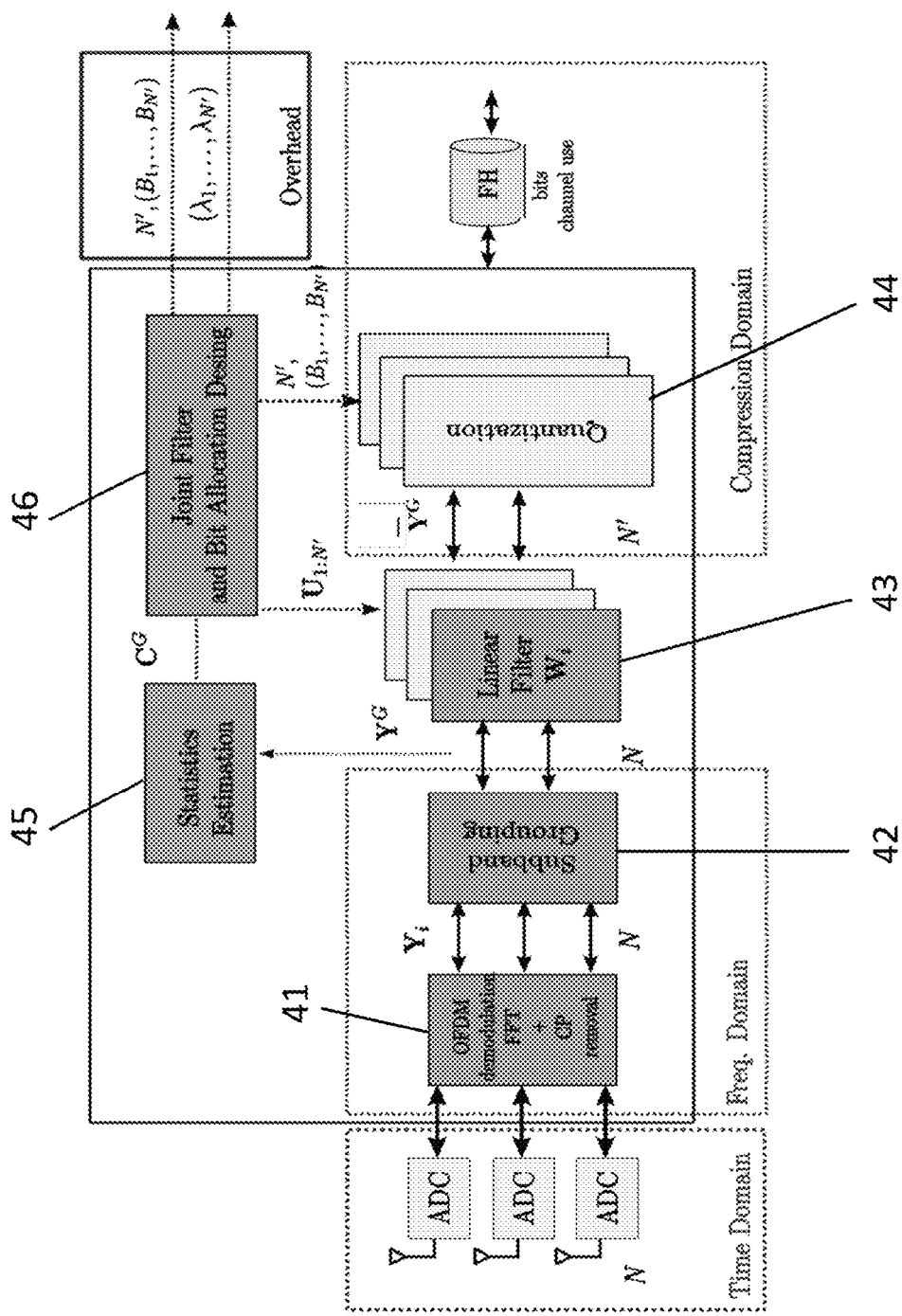
FIG. 5 shows the front-end part 400B-RRU of the multi-antenna receiver 400B, i.e., the part comprising the RRU node, according to an embodiment of the present invention.

Referring to FIG. 5 in conjunction with FIG. 4, each analog time-domain signal is received at the N antennas of the RRU, i.e., the front-end part 400B-RRU of the multi-antenna receiver 400B, and then sampled and processed by a respective ADC amongst a number N of ADCs, as to obtain a respective digital time-domain signal carrying a same set of $N_{sc}$ subcarriers.

Afterwards, each digital time-domain signal at the RRU is converted to a respective digital frequency-domain signal ($Y_i$) using an OFDM-like demodulation through the module 41 with, for example, FFT and CP removal. After this frequency-domain processing, the signal $Y_i \in \mathbb{R}^{N \times N_{ss}}$, which is received at the i-th subcarrier in a $RB_g$ during one TTI, is given by:

$$Y_i = H_i X_i + Z_i, i=1,2,\ldots,N_{sRB} \quad (1)$$

where the channel matrix $H_i$ is defined as $H_i = [h_{i,1}^T, \ldots, h_{i,N}^T] \in \mathbb{R}^{N_1 \times K}$, where $h_{i,k} = [h_{i,k,1}, \ldots h_{i,k,L}]^T$ with $h_{i,k,l}$ denoting the channel coefficient between the k-th receive antenna and the l-th UE device at the i-th subcarrier in the $RB_g$, and with T denoting the matrix transpose operation, and where $Z_i \in \mathbb{R}^{N \times N_{ss}}$ is the independent and identically distributed (i.i.d.) zero-mean additive noise vector sequence of length $N_{ss}$ experienced at the N antennas with $C_z = \sigma^2 I$, where $C_z$ represents the covariance matrix of the additive noise, $\sigma$ represents the variance of noise, i.e., $E[Z_{i,k,j}Z_{i,k',j'}] = \sigma^2$ for k=k' and j=j', and $E[Z_{i,k,j}Z_{i,k',j'}] = 0$ for k≠k' and j≠j', and I represents the identity matrix with diagonal elements equal to one, and otherwise equal to zero for the other elements of the identity matrix.

In an embodiment, the channel matrix $H_i$ observed in a subcarrier during one TTI may remain constant and vary amongst the subcarriers in the same RB according to a D taps Rayleigh fading model as follows:

$$H_i = \sum_{d=1}^{D-1} G(d)\exp\left(-j2\pi \frac{id}{N_{sc}}\right) \quad (2)$$

where G(d) is the matrix containing the d-th tap corresponding to the gains between the antennas and the UE devices of the (D-1)-finite impulse response (FIR) of the channel.

In another embodiment, the channel matrix $H_i$ may be modelled by considering the variations of the channel over a TTI.

The $N_{ss}$ symbols of each converted digital frequency-domain signal ($Y_i$) are then grouped per subcarrier through the module 42, as to obtain, in each one of the $N_{sc}$ subcarriers, a respective grouped digital frequency-domain signal ($Y^g$) of N× $N_{ss}$ symbols. In an embodiment, the subcarriers may be grouped into resource blocks (RBs) according to a pattern, each resource block ($RB_g$) having a respective number ($N_{sRBg}$) of subcarriers. For example, the subcarriers may be grouped into G groups (also denoted by sub-bands) according to the same RBs and the same transmission time interval (TTI), thereby forming as many groups as there are RBs, or according to multiple RBs and multiple TTIs. The pattern may be predefined by being, for example, transmitted towards the RRU and/or the BBU in advance. Alternatively, the pattern may be dynamically changed and updated by being, for example, regularly transmitted towards the RRU and/or the BBU through the fronthaul (FH) link.

In the case that the subcarriers are grouped according to the same RBs and the same TTI, the grouped digital frequency-domain signal $Y^g \in \mathbb{R}^{N \times n}$ from the group g (where g=1, ..., G) associated to the $RB_g$ during one TTI may be defined by:

$$Y^g = [Y_1, Y_2, \ldots, Y_{sRB}] \quad (3)$$

Per subcarrier, the N×$N_{ss}$ symbols of each grouped digital frequency-domain signal ($Y^g$) are combined through the module 43 into N'×$N_{ss}$ symbols with N' being a number lower than N, as to obtain, in each one of the $N_{sc}$ subcarriers, a respective combined digital frequency-domain signal ($\overline{Y^g}$) of N'×$N_{ss}$ symbols. The combination may be considered a projection of each grouped digital frequency-domain signal ($Y^g$) to a space of dimensionality N' reduced with respect to N. The combination or projection of each grouped digital frequency-domain signal ($Y^g$) may be performed at each subcarrier through filtering using, for example, a respective finite impulse response (FIR) filter or a respective linear filter. The linear filter may use a projection matrix $W_i \in \mathbb{R}^{N \times N'}$, where N' is the dimension of the projected space, so that the combined digital frequency-domain signal ($\overline{Y^g}$) of N'×$N_{ss}$ symbols may be obtained by the following relationship:

$$\overline{Y^g} = W_i^H Y^g, \text{ where } \overline{Y^g} \in \mathbb{R}^{N' \times n} \quad (4)$$

The dimensionality N' of the projected space may be determined by the module 46 using estimated statistical information from the module 45, and then transmitted towards the module 43. In an alternative embodiment, the dimensionality N' may be set in advance and then transmitted towards the module 43.

The module 45 is configured to estimate statistical information of each one of the grouped digital frequency-domain signals ($Y^g$) output from the module 42, the estimated statistical information being then used by the module 46 for the joint design of the modules 43 (combination or projection) and 44 (quantization or compression). The estimation is achieved using an estimator such as a covariance matrix $C^g$ of each one of the grouped digital frequency-domain signals ($Y^g$), which may be defined by the following relationship:

$$C^g = \frac{1}{N_{ss}N_{sc}} Y^g Y^{g,H} \quad (5)$$

It should be noted that the covariance matrix $C^g$ is an estimator of the average covariance of the channels due to the high correlation of the channels in the same TTI, and that the estimation may be improved by exploiting any relevant additional statistical information (e.g., prior statistics on the distribution of the covariance matrix $C^g$).

The N'×$N_{ss}$ symbols of the combined digital frequency-domain signals ($\overline{Y^g}$) in each subcarrier are quantized or compressed through the module 44, as to obtain, in each subcarrier, a respective quantized or compressed digital frequency-domain signal of quantization or compression bits. The number of quantization bits may be determined by the module 46 using estimated statistical information from the module 45, and then transmitted towards the module 44. In an embodiment, the quantization of each one of the components of the N' dimensional vector sequence $\overline{Y^g} = [y_1^g, \ldots, y_{N'}^g]$ may be achieved independently at $B_t$ bits (where t=1, ..., N') per sample for each component. For example, this can be carried out by a sample-by-sample uniform quantizer with $2^{B_t}$ levels. In other embodiments, the N' components of $\overline{Y^g}$ may be compressed jointly or with any other compressor algorithm. But either way, the number of bits per component ($B_1, \ldots, B_{N'}$) and the dimension N' are determined by the module 46.

In more details, the module 46 considers the joint design of the combination (projection) and quantization (compression) parameters to quantize (compress) each one of the components of the N' dimensional vector sequence $\overline{Y^g}=[\overline{y_1^g},...,\overline{y_{N'}^g}]$, i.e., the N'×$N_{ss}$ symbols of the combined digital frequency-domain signals ($\overline{Y^g}$) in each subcarrier.

In an exemplary embodiment, the joint design will be based on a design method, which utilizes the covariance matrix $C^g$ and the available fronthaul bits B per sample and which is intended for vector data compression based on transform coding principles as found, for example, in: A. E. Gamal and Y. H. Kim, "Network Information Theory", Cambridge University Press, 2011. As aforementioned, this module 46 determines the projection matrix the dimensionality N' of the projected space, and the bits assigned to each projected component ($B_1, \ldots, B_{N'}$) required to generate the compression message m of $n(B_1+ \ldots +B_{N'})$=nB bits, where B is the number of total bits per sample available from the fronthaul link.

In this exemplary embodiment, the singular value decomposition (SVD) of the covariance matrix $C^g$ is computed as $C^g=U\Lambda U^T$, where $\Lambda=[\lambda_1, \ldots, \lambda_N]$ and $(\lambda_1, \ldots, \lambda_N)$ are the eigenvalues of $C^g$ and correspond to the variance (or energy) in the t-th dimension of $U^T Y^g$. Let the projection matrix $W_i$ be given by the N' eigenvectors associated with the N' largest eigenvalues, i.e., $W_i=U_{1:N'}$, then the dimension N' and the number of quantization bits per component of the projected component $B_t$ (where t=1, ..., N') are obtained with the following reverse water filling convex problem:

$$(B_1, \ldots, B_N) = \text{argmin} \sum_{t=1}^{N} \log\left(\frac{\lambda_t}{d_t}\right), \text{ s.t. } \sum_{t=1}^{N} d_t = B \quad (6)$$

where $d_t=\min\{\lambda_t, \theta\}$, $\lambda_t$ is the t-th eigenvalue of $C^g$ and $\theta$ is chosen such that the constraint can be met.

In another exemplary embodiment, the projection matrix $W_i$, the quantization bits and the dimensionality N' of the projected space may be designed differently using the statistical information obtained from the module 45 and the available fronthaul bits.

Figure 6:
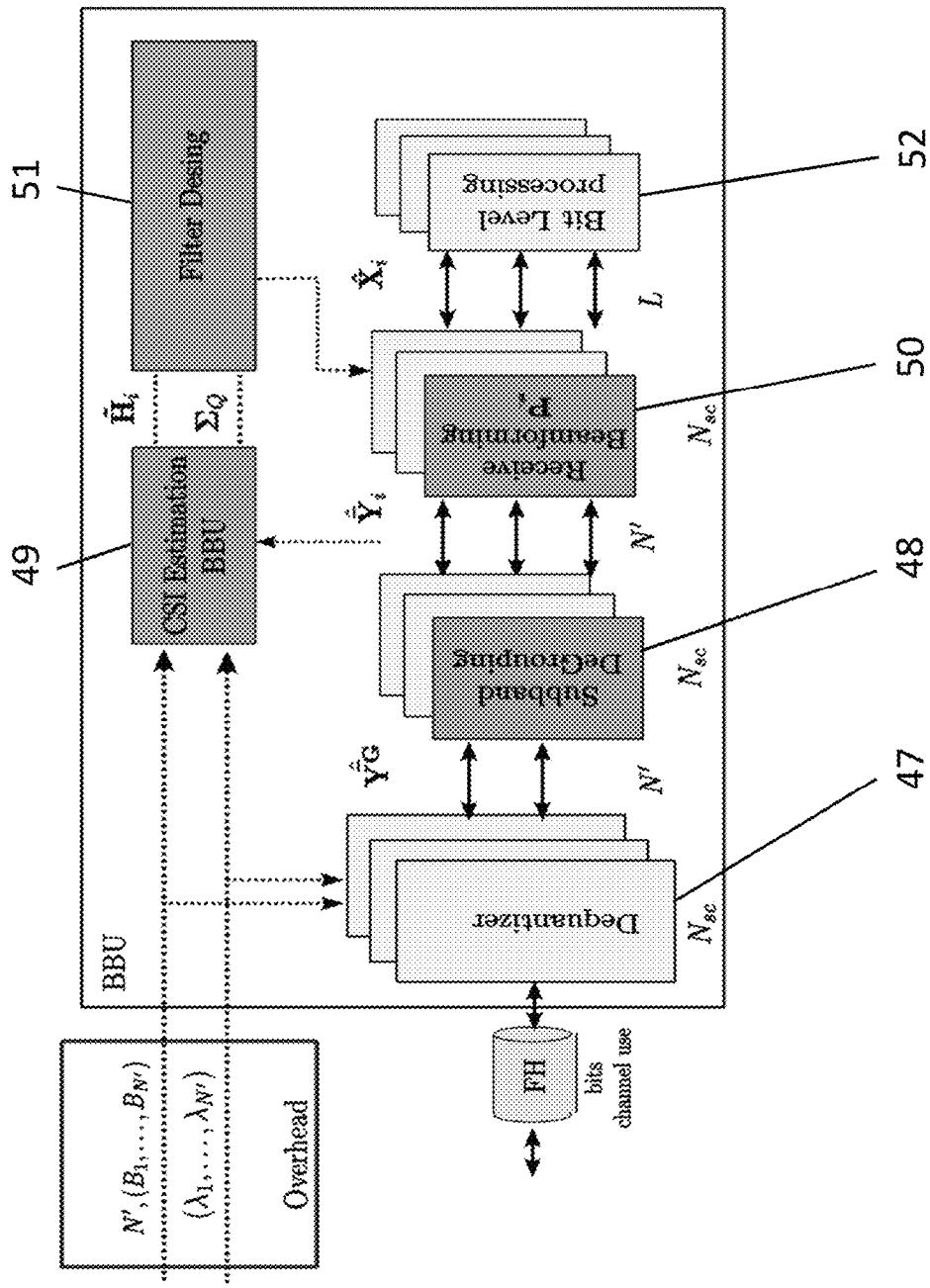
FIG. 6 shows the rear-end part 400B-BBU of the multi-antenna receiver 400B, i.e., the part comprising the BBU node, according to an embodiment of the present invention.

After the quantization (or compression), the resulting $n(B_1+ \ldots +B_{N'})$ bits, i.e., the quantization bits of the quantized digital frequency-domain signals in each subcarrier, together with a set of overhead parameters required for the decompression at the BBU, are forwarded through the FH link towards the BBU, i.e., towards the rear-end part 400B-BBU of the multi-antenna receiver 400B, as depicted in FIG. 6. The set of overhead parameters may comprise the value of the dimensionality N', the values ($B_1, \ldots, B_{N'}$) of each quantization bit, and the eigenvalues ($\lambda_1, \lambda_2, \ldots, \lambda_{N'}$) of each covariance matrix ($C^g$) of each one of the grouped digital frequency-domain signals ($Y^g$).

It should be noted that the projection matrix ($W_i$) is not forwarded towards the BBU, and the formatting of the FH packets transmitted through the FH link can accommodate different formats to transmit the quantized data and the overhead parameters required for the decompression procedure at the BBU.

Referring to FIG. 6 in conjunction with FIG. 4, the BBU, i.e., the rear-end part 400B-BBU of the multi-antenna receiver 400B, receives, at the module 47, the quantization bits of the quantized digital frequency-domain signals in each subcarrier, i.e., the $n(B_1+ \ldots +B_{N'})$ bits resulting from the quantization (or compression) of the N'×$N_{ss}$ symbols of the combined digital frequency-domain signals ($Y^g$), and the set of overhead parameters comprising the value of the dimensionality N', the values ($B_1, \ldots, B_{N'}$) of each quantization bit and the eigenvalues ($\lambda_1, \lambda_2, \ldots, \lambda_{N'}$) of each covariance matrix ($C^g$) of each one of the grouped digital frequency-domain signals ($Y^g$).

Then, the module 47 decompresses each quantized digital frequency-domain signal using the set of overhead parameters, as to obtain, in each one of the $N_{sc}$ subcarriers, a respective decompressed digital frequency-domain signal $\widetilde{Y^g}$ of N'×$N_{ss}$ symbols, which may be defined by the following relationship:

$$\widetilde{Y^g} = WY^g + Q, \quad (7)$$

where Q~N(0, $\Sigma_Q$) is the quantization noise with a covariance matrix denoted by $\Sigma_Q$. In an embodiment, the quantization noise Q may be assumed Gaussian independent and identically distributed (i.i.d.), and the covariance matrix $\Sigma_Q$ may be expressed as: $\Sigma_Q=\text{diag}(\lambda_1 2^{-B_1}, \ldots, \lambda_{N'} 2^{-B_{N'}})$. In another embodiment, the quantization noise Q may be differently defined or be with a differently defined covariance matrix.

The module 48 degroups each decompressed digital frequency-domain signal of N'×$N_{ss}$ symbols, as to obtain a respective degrouped digital frequency-domain signal of N'×$N_{ss}$ symbols. In other terms, the module 48 maps each decompressed digital frequency-domain signal of N'×$N_{ss}$ symbols into the original format of the received signal. In particular, each one of the grouped digital frequency-domain signals ($Y^g$) is mapped to the corresponding subcarrier and OFDM symbol position in the original frame structure of the RB. The degrouped digital frequency-domain signal $\widetilde{Y_i}$ in the i-th subcarrier for the $RB_g$ may be expressed as follows:

$$\hat{Y}_i = W^H Y_i + Q = W^H(H_i X_i + Z_i) + Q = \widetilde{H}_i X_i + \widetilde{Z}_i + Q, \quad (8)$$

where $\widetilde{H}_i = WH_i$ is the effective channel after projection (or combination), $\widetilde{Z}_i \sim N(0, I_{N'})$ is the projected noise of the projected (or combined) signal with a covariance matrix denoted by $\Sigma_Q$. The projected noise $\widetilde{Z}_i$ may be assumed Gaussian independent and identically distributed (i.i.d.), and the covariance matrix $\Sigma_Q$ may be defined as: $\Sigma_Q=\text{diag}(\lambda_1 2^{-B_1}, \ldots, \lambda_{N'} 2^{-B_{N'}})$.

In an embodiment, the pattern may be dynamically changed and updated during the communication procedure between the RRU and the BBU.

As depicted in FIG. 6, the module 49 may also receive the set of overhead parameters. Based on these overhead parameters, on the respective degrouped digital frequency-domain signal $\widetilde{Y}_i$ of N'×$N_{ss}$ symbols and on the quantization noise Q~N(0, $\Sigma_Q$), the module 49 may estimate respective channel state information (CSI), denoted by $\widehat{\widetilde{H}}_i$, of the effective channel $\widetilde{H}_i$, under which the transmitted user symbols are observed. It should be noted that the effective channel $\widetilde{H}_i$ is of lower dimension that the original channel $H_i$ and thereby requires less pilots for its estimation. The channel may be estimated from pilots with, for example, a linear minimum mean square error (MMSE) estimator. However, this linear filter estimation still accounts for the effect of the quantization noise Q~N(0, $\Sigma_Q$). In an embodiment, the effective channel coefficients may be estimated with any other method accounting for the statistics of the quantization error of the projected signal.

At the module 50, each degrouped digital frequency-domain signal $\widetilde{Y}_i$ of N'×$N_{ss}$ symbols is filtered using a respective filtering coefficient denoted by $P_i$, which is computed at the module 51 based on the respective estimated CSI denoted by $\widehat{\widetilde{H}}_i$ and the quantization noise Q~N(0, $\Sigma_Q$), as to obtain a respective filtered digital frequency-domain signal $\hat{X}_i$ of L×$N_{ss}$ symbols, where L equals the number of transmitters (e.g., UEs, users), verifying the following relationship:

$$\hat{X}_i = P_i \widetilde{Y}_1, \text{ where } \widetilde{Y}_1 = \widetilde{\overline{H}}_1 X_i + \widetilde{Z}_1 + Q \qquad (9)$$

$P_i$ may be considered the MMSE estimate of $X_i$ from $\widetilde{Y}_1$, and may thereby verify the following relationship:

$$P_i = P \widetilde{\overline{H}}_1 (P \widetilde{\overline{H}}_1 \widetilde{\overline{H}}_1^H + \sigma^2 I + \Sigma_Q)^{-1} \qquad (10)$$

where P is the transmit power per user and $\sigma^2$ is the noise power.

Afterwards, each filtered digital frequency-domain signal $\hat{X}_i$ is decoded through the module 52, as to obtain a respective decoded signal corresponding to the messages ($m_1, \ldots, m_l, \ldots, m_L$) transmitted by the transmitters (e.g., UEs, users) towards the multi-antenna receiver (Rx).

It should be noted that all the constituent modules (i.e., modules 41 to 52, ADCs) of the multi-antenna receiver 400B may be physically distributed among other devices or physically collocated inside the same device.

In order to illustrate the advantages and beneficial effects of the present disclosure within a MU-MIMO communication system 400 as disclosed in FIG. 4, the performance of both the standard common public radio interface (CPRI) compression technique and the proposed compression technique of the present disclosure has been compared through numerical simulations.

To do so, an exemplary experimental uplink MIMO communication system 400 has been implemented with the following features:

Channel model: LTE 20 MHz model with 100 resource blocks (RBs) and 12 subcarriers per RB. The channel matrix H following an uncorrelated Rayleigh fading channel model over all the subcarriers;

Transmitter model: L={8, 16} UEs per RB transmitting i.i.d. Gaussian codewords with a same respective power P;

RRU node: N=64 antennas; and

BBU model: MMSE filtering.

The standard CPRI compression framework under test has been characterized by a compression per antenna (standard CPRI) and a frequency-domain CPRI compression, in which the received signal has been compressed in the frequency domain using a transform coding and then reconstructed (i.e., decompressed) at the BBU in the frequency domain.

To assess the comparative performance, the error vector magnitude (EVM) distortion and the compression gain or ratio (CR) have been investigated as figures of merit.

The error vector magnitude (EVM) has made it possible to measure the average quadratic error between the symbols X transmitted by the L UEs, and the symbols $\hat{X}$ estimated after filtering at the destination unit (i.e., BBU). The average quadratic error has been averaged over all the carriers with useful information, and EVM has been defined by the following relationship:

$$EVM = \frac{\sum_{i=1}^{N_{sc}} \sum_{l=1}^{L} E\|x_{l,i} - \widehat{x_{1,1}}\|^2}{\sum_{i=1}^{N_{sc}} \sum_{l=1}^{L} \sum_{k=1}^{K} E\|x_{l,i}\|^2} \qquad (11)$$

The compression gain or ratio (CR) has made it possible to compare the FH requirements and has been expressed as:

$$CR = \frac{B_{no-comp}}{B_{method}} \qquad (12)$$

where $B_{no-comp}$ features the bits (throughput) required to transmit n vector samples between the RRU and the destination unit (BBU) if no processing/compression is considered, and $B_{method}$ features the bits (throughput) required to achieve the same EVM if some processing/compression is utilized.

Figure 7:
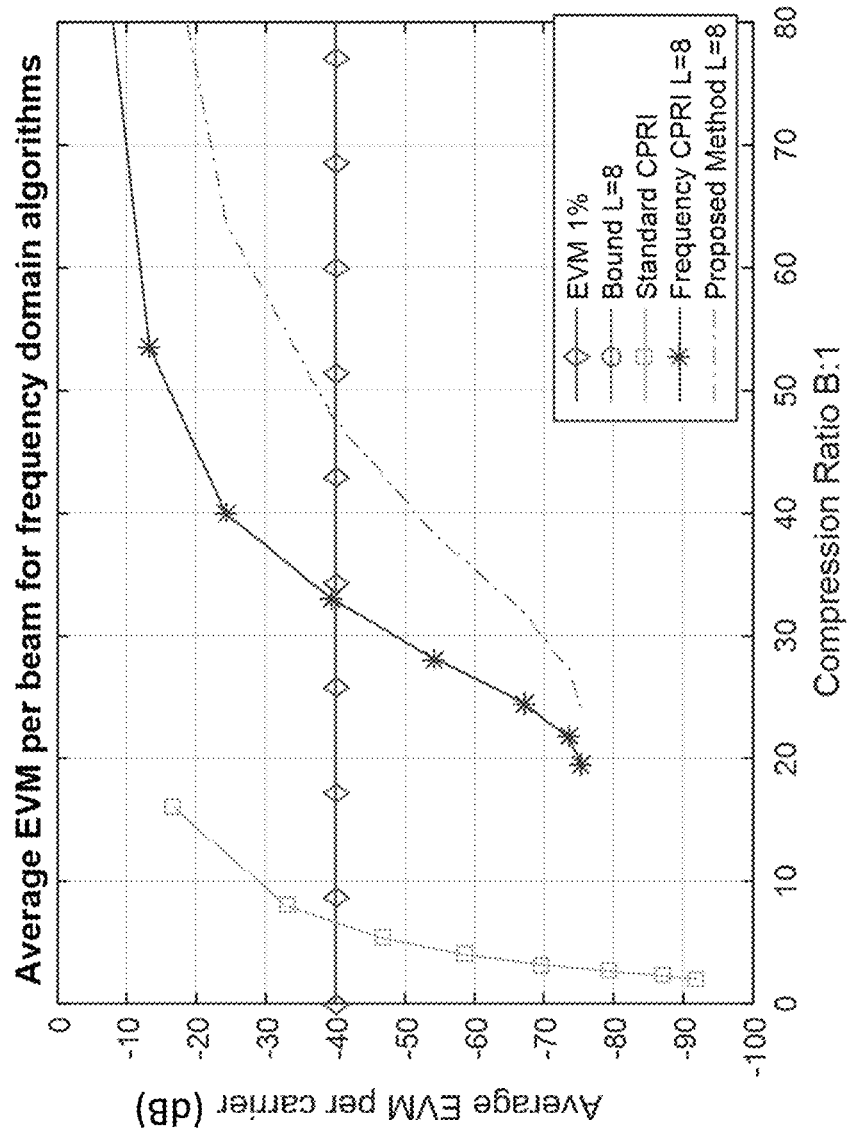
FIG. 7 shows a comparison chart of the average error vector magnitude (EVM) versus the compression ratio (CR) for different compression frameworks in the case of a MU-MIMO system with L=8 UEs.
Figure 8:
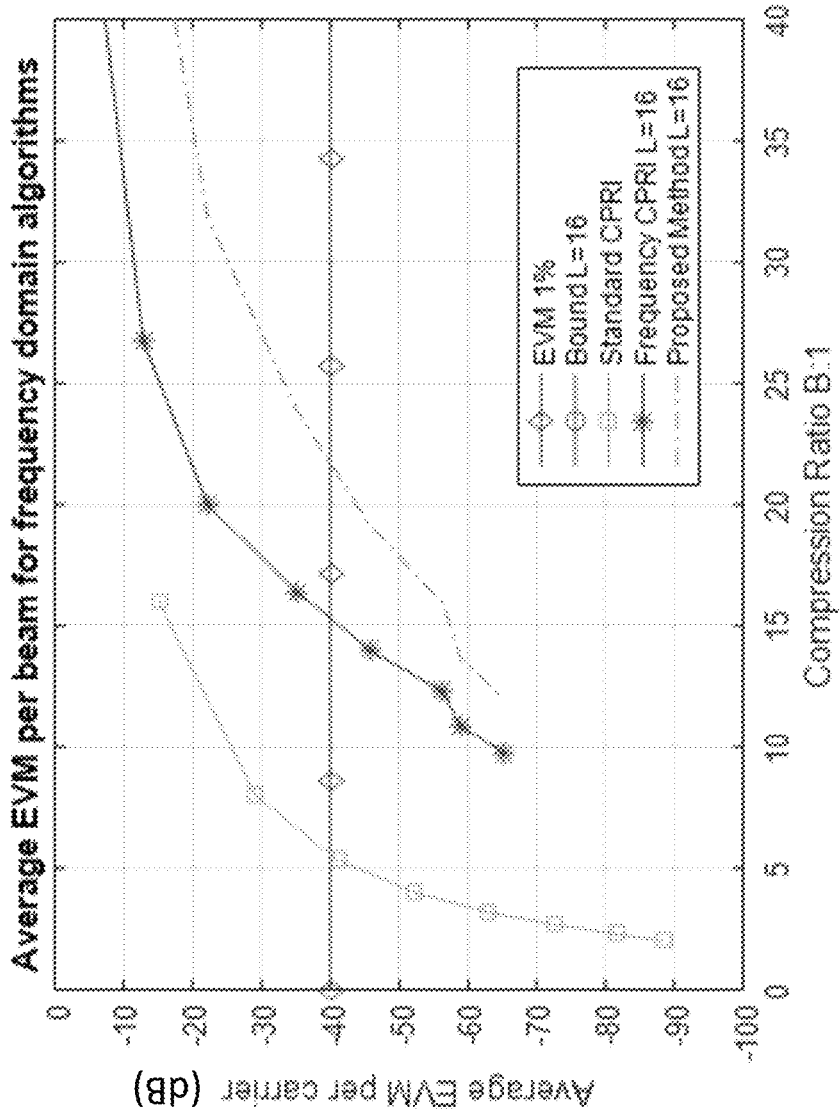
FIG. 8 shows a comparison chart of the average error vector magnitude (EVM) versus the compression ratio (CR) for different compression frameworks in the case of a MU-MIMO system with L=16 UEs.

The simulations results are presented in FIGS. 7 and 8 as comparison charts of the average error vector magnitude (EVM) versus the compression ratio (CR) for different compression frameworks in the case of a MU-MIMO system with L=8 UEs and 16 UEs, respectively.

For each one of these comparison charts, the average EVM is provided per user symbol averaged over 1000 channel realizations for both a standard CPRI compression method (denoted by standard CPRI in the legend), a frequency-domain CPRI method (denoted by frequency CPRI in the legend), and the proposed compression method (denoted by proposed method in the legend) of the present disclosure.

Merely for reference values, theoretical bounds (denoted respectively by EVM 1% and bound in the legend) have been incorporated into the comparison charts of FIGS. 7 and 8. The theoretical bound on the EVM at −40 dB corresponds to EVM=1%. The theoretical bound on the minimum EVM achievable for the underlying MU-MIMO system serves as the fundamental lower bound on the EVM.

From the analysis of the obtained simulation results, the benefits of the present disclosure with respect to the standard and frequency-domain CPRI compression solutions can be listed as follows:

the FH throughput requirements to achieve the same level of EVM can be reduced or the EVM for the same compression ratio (CR) (i.e., bitrate) can be improved. For illustrative purposes, Table I compares the obtained CR values at EVM=−40 dB (i.e., at EVM=1%) for the standard CPRI method, the frequency-domain CPRI method and the proposed compression method when L=8 UEs and L=16 UEs;

TABLE I

| CR values at EVM = 1% | | | |
| --- | --- | --- | --- |
| CR at EVM = 1% | Standard CPRI | Frequency CPRI | Proposed method |
| L = 8 | 7:1 | 28:1 | 47:1 |
| L = 16 | 7:1 | 16:1 | 22:1 | the average dimension N of the projected space can be lower that the number of antennas N (e.g., for L=8 UEs: E [N']=10, and for L=16 UEs: E [N']=20). Thereby, the baseband processing and the CSI requirements can be drastically reduced;

the proposed compression solution can be implemented with low complexity and the design of the compression parameters per group also results in a reduced complexity; and the proposed compression solution can be implemented with a sample-by-sample compression, thereby resulting in a low delay.

It should be noted that in the event that different types of time-domain data are received, the received time-domain signal can be divided according to these data types and compressed with the proposed compression method or any other compression methods.

It should be further noted that the CPRI or FH resources allocated to each compression type can be accommodated with a controller, e.g., a rate allocation controller.

It should be also noted that the formatting of the CPRI or FH packets transmitted through the FH link can accommodate different formats to transmit the quantized data and the overhead parameters required for the decompression procedure at the BBU.

In summary, the present disclosure relates to a multi-antenna receiver (400B) within an uplink MIMO communication system (400), which comprises at least one RRU (400B-RRU) and at least one BBU (400B-BBU) communicating between themselves through a fronthaul (FH) link. The proposed multi-antenna receiver (400B) allows to significantly decrease the fronthaul (FH) throughput requirements, while guaranteeing a low EVM between the time-domain signals transmitted from the users (400A) towards the RRU (400B-RRU) and the signals reconstructed and recovered at the BBU (400B-BBU). The RRU (400B-RRU), which is provided with frequency processing functionalities, processes the obtained frequency-domain signals in a space of dimensionality N by projecting them into a signal space of lower dimensionality (N') and compressing them in the obtained projected signal subspace. At the BBU (400B-BBU), the frequency-domain signals are decompressed and reconstructed on the projected signal subspace, before recovering the transmitted time-domain signals. Thereby, the quality of the signal being decompressed and reconstructed at the BBU (400B-BBU) may be not compromised when the FH throughput gets reduced. In addition, the uplink MIMO communication system (400) may reduce the fronthaul (FH) requirements and the complexity by exploiting the spatial correlation of the received signal and by directly processing the decompressed signal into the projected signal domain of lower dimensionality than the original received signal. In this way, the FH throughput requirements between the RRU (400B-RRU) and the BBU (400B-BBU) may be improved.

While the present invention has been illustrated and described in detail in the drawings and the foregoing description, such illustration and description are to be considered illustrative or exemplary and not restrictive. The invention is not limited to the disclosed embodiments. From reading the present disclosure, other modifications will be apparent to a person skilled in the art. Such modifications may involve other features, which are already known in the art and may be used instead of or in addition to features already described herein.

The invention has been described in conjunction with various embodiments herein. However, other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

Although the present invention has been described with reference to specific features and embodiments thereof, it is evident that various modifications and combinations can be made thereto without departing from the spirit and scope of the invention disclosure. The specification and drawings are, accordingly, to be regarded simply as an illustration of the invention as defined by the appended claims, and are contemplated to cover any and all modifications, variations, combinations or equivalents that fall within the scope of the present invention and its disclosure provided herein.

What is claimed is:

1. An apparatus within an uplink multi-input multi-output (MIMO) communication system, the apparatus being configured to:
   receive, from each one of a number N of antennas, a respective digital time-domain signal, wherein each one of the N respective digital time-domain signals carries a same quantity of $N_{sc}$ subcarriers, and wherein each one of the subcarriers has a same quantity of $N_{ss}$ symbols;
   convert each one of the N respective digital time-domain signals to a respective converted digital frequency-domain signal having $N_{sc}$ subcarriers and $N_{ss}$ symbols per subcarrier;
   group, on a per subcarrier basis, the $N_{ss}$ symbols of each one of the respective converted digital frequency-domain signals to obtain, in each one of the $N_{sc}$ subcarriers, a respective grouped digital frequency-domain signal of N×$N_{ss}$ symbols;
   combine, on a per subcarrier basis, the N×$N_{ss}$ symbols of each one of the respective grouped digital frequency-domain signal into N'×$N_{ss}$ symbols, wherein N' is a quantity that is lower than the number N of antennas, to obtain, for each one of the $N_{sc}$ subcarriers, a respective combined digital frequency-domain signal of N'×$N_{ss}$ symbols; and
   quantize the N'×$N_{ss}$ symbols of the combined digital frequency-domain signals in each subcarrier, to obtain, for each subcarrier, a respective quantized digital frequency-domain signal of quantization bits.

2. The apparatus of claim 1, wherein the subcarriers are grouped into resource blocks according to a pattern, wherein each resource block has a number of sub carriers.

3. The apparatus of claim 1, wherein the apparatus is configured to:
   estimate statistical information of each one of the grouped digital frequency-domain signals.

4. The apparatus of claim 3, wherein the statistical information of each one of the respective grouped digital frequency-domain signals is estimated using a covariance matrix of each one of the respective grouped digital frequency-domain signals.

5. The apparatus of claim 4, wherein the N×$N_{ss}$ symbols of each respective grouped digital frequency-domain signal are combined, in each subcarrier, into N'×$N_{ss}$ symbols through filtering.

6. The apparatus of claim 5, wherein the filtering is performed using a projection matrix.

7. The apparatus of claim 6, wherein the projection matrix, the number N' and the number of quantization bits are determined using the statistical information.

8. The apparatus of claim 7, wherein the apparatus is configured to:
transmit a set of overhead parameters,
wherein the set of overhead parameters comprises:
a value of the number N',
values of each quantization bit, and
eigenvalues of each covariance matrix.

9. The apparatus of claim 1, wherein the apparatus is configured to:
transmit the quantization bits of each subcarrier by transmitting the respective quantized digital frequency-domain signals.

10. A method carried out by an apparatus within an uplink multi-input multi-output (MIMO) communication system, the method comprising:
receiving, from each one of a number N of antennas, a respective digital time-domain signal, wherein each one of the N respective digital time-domain signals carries a same quantity of $N_{sc}$ subcarriers, and wherein each one of the subcarriers has a same quantity of $N_{ss}$ symbols;
converting each one of the N respective digital time-domain signals to a respective converted digital frequency-domain signal having $N_{sc}$ subcarriers and $N_{ss}$ symbols per subcarrier;
grouping, on a per subcarrier basis, the $N_{ss}$ symbols of each one of the respective converted digital frequency-domain signals to obtain, in each one of the $N_{sc}$ subcarriers, a respective grouped digital frequency-domain signal of $N \times N_{ss}$ symbols;
combining, on a per subcarrier basis, the $N \times N_{ss}$ symbols of each one of the respective grouped digital frequency-domain signal into $N' \times N_{ss}$ symbols, wherein N' is a quantity that is lower than the number N of antennas, to obtain, for each one of the $N_{sc}$ subcarriers, a respective combined digital frequency-domain signal of $N' \times N_{ss}$ symbols; and
quantize the $N' \times N_{ss}$ symbols of the combined digital frequency-domain signals in each subcarrier, to obtain, for each subcarrier, a respective quantized digital frequency-domain signal of quantization bits.

11. The method of claim 10, wherein the subcarriers are grouped into resource blocks according to a pattern, wherein each resource block has a number of sub carriers.

12. The method of claim 10 further comprising:
estimating statistical information of each one of the grouped digital frequency-domain signals.

13. The method of claim 12, wherein the statistical information of each one of the respective grouped digital frequency-domain signals is estimated using a covariance matrix of each one of the respective grouped digital frequency-domain signals.

14. The method of claim 13, wherein the $N \times N_{ss}$ symbols of each respective grouped digital frequency-domain signal are combined, in each subcarrier, into $N' \times N_{ss}$ symbols through filtering.

15. The method of claim 14, wherein the filtering is performed using a projection matrix.

16. The method of claim 15, wherein the projection matrix, the number N' and the number of quantization bits are determined using the statistical information.

17. The method of claim 16 further comprising:
transmitting a set of overhead parameters,
wherein the set of overhead parameters comprises:
a value of the number N',
values of each quantization bit, and
eigenvalues of each covariance matrix.

18. The method of claim 10 further comprising:
transmitting the quantization bits of each subcarrier by transmitting the respective quantized digital frequency-domain signals.

* * * * *

UNITED STATES PATENT AND TRADEMARK OFFICE
CERTIFICATE OF CORRECTION

PATENT NO. : 11,206,713 B2
APPLICATION NO. : 16/728989
DATED : December 21, 2021
INVENTOR(S) : Estella Aguerri et al.

It is certified that error appears in the above-identified patent and that said Letters Patent is hereby corrected as shown below:

In the Claims

Claim 2: Column 16, Line 49: "each resource block has a number of sub carriers." should read -- each resource block has a number of subcarriers. --.

Claim 11: Column 18, Line 7: "each resource block has a number of sub carriers." should read -- each resource block has a number of subcarriers. --.

Signed and Sealed this
Seventeenth Day of May, 2022

Katherine Kelly Vidal
*Director of the United States Patent and Trademark Office*